United States Patent
Tsubaki

(10) Patent No.: US 8,957,693 B2
(45) Date of Patent: Feb. 17, 2015

(54) IC DEVICE TESTING SOCKET

(75) Inventor: Yuichi Tsubaki, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 216 days.

(21) Appl. No.: 13/497,132

(22) PCT Filed: Sep. 21, 2010

(86) PCT No.: PCT/US2010/049559
§ 371 (c)(1),
(2), (4) Date: Mar. 20, 2012

(87) PCT Pub. No.: WO2011/041158
PCT Pub. Date: Apr. 7, 2011

(65) Prior Publication Data
US 2012/0182037 A1    Jul. 19, 2012

(30) Foreign Application Priority Data
Sep. 29, 2009  (JP) ................. 2009-224929

(51) Int. Cl.
*G01R 31/26*  (2014.01)
*G01R 1/04*  (2006.01)
*G01R 1/073*  (2006.01)

(52) U.S. Cl.
CPC .......... *G01R 1/0483* (2013.01); *G01R 1/07314* (2013.01)
USPC .................................................. 324/756.02

(58) Field of Classification Search
CPC ............. G01R 1/0483; G01R 1/07314; G01R 1/0491; G01R 1/06761; G01R 1/07307; G01R 31/2831; G01R 31/2863; G01R 31/2896

USPC ...................................... 324/756.02; 257/678
See application file for complete search history.

(56) References Cited

U.S. PATENT DOCUMENTS

| 5,480,309 | A | 1/1996 | Arisaka |
| 5,502,397 | A | 3/1996 | Buchanan |
| 5,854,534 | A | 12/1998 | Beilin et al. |
| 6,512,389 | B1 | 1/2003 | Kocher |

(Continued)

FOREIGN PATENT DOCUMENTS

| EP | 1 478 215 | 11/2004 |
| JP | S61-069836 U | 5/1986 |

(Continued)

OTHER PUBLICATIONS

PCT International Search Report for PCT/US2010/049559 mailed Dec. 21, 2010, 5 pages.

*Primary Examiner* — Tung X Nguyen
(74) *Attorney, Agent, or Firm* — Robert S. Moshrefzadeh

(57) ABSTRACT

To provide an IC device testing socket, capable of improving signal transmission efficiency during testing an IC device, without deteriorating the replacement workability of contact pins. A substrate 2 has dielectric layers 22-25 embedded in a base material 21 constituted by dielectric material such as glass epoxy. Each dielectric layer has a conductive layer, such as copper, formed on both sides thereof. Each of contact pins 3 extends generally perpendicular to surfaces 26 and 27 of substrate 2, and penetrates substrate 2. A through hole 28, into which each contact pin may be pressed, is formed in base material 21 of substrate 2, each high-dielectric layer and conductive layer. A conductive material 281, such as copper, is formed on an inner surface of each through hole 28.

13 Claims, 2 Drawing Sheets

(56) References Cited

U.S. PATENT DOCUMENTS

| | | |
|---|---|---|
| 6,891,258 B1 * | 5/2005 | Alexander et al. ............ 257/678 |
| 7,927,109 B1 | 4/2011 | Gattuso |
| 2002/0180469 A1 | 12/2002 | Wu et al. |
| 2004/0147140 A1 | 7/2004 | Fan et al. |
| 2004/0196025 A1 | 10/2004 | Casey et al. |
| 2005/0145842 A1 | 7/2005 | Maekawa et al. |
| 2006/0132160 A1 | 6/2006 | Kinoshita |
| 2009/0085593 A1 | 4/2009 | Yoshida et al. |

FOREIGN PATENT DOCUMENTS

| | | |
|---|---|---|
| JP | 2003-023257 | 1/2003 |
| JP | 2003 050262 | 2/2003 |
| JP | 2009-85948 | 4/2009 |
| JP | 2009 270835 | 11/2009 |
| WO | WO 99/41812 | 8/1999 |
| WO | 02/27335 | 4/2002 |
| WO | 2005/006003 | 1/2005 |
| WO | 2006/062911 | 6/2006 |

* cited by examiner

IC DEVICE TESTING SOCKET

CROSS REFERENCE TO RELATED APPLICATIONS

This application is a national stage filing under 35 U.S.C. 371 of PCT/US2010/049559, filed 21 Sep. 2010, which claims priority to Japanese Application No. 2009-224929, filed 29 Sep. 2009, the disclosure of which is incorporated by reference in its entirety herein.

TECHNICAL FIELD

The present invention relates to a socket used to test a semiconductor integrated circuit (hereinafter, referred to as "IC") device such as a CPU or a memory device, and in particular, relates to an IC device testing socket having a capacitor function for testing a semiconductor package.

BACKGROUND

In carrying out an evaluation test of signal transmission property or the like of an IC device such as a BGA (ball grid array) device, an IC socket, having contacts each connectable to each terminal of the IC device, is used. In recent years, a frequency of a signal used in the IC device becomes higher, as a processing speed of the IC device becomes higher. Corresponding to such a high-speed signal, the IC socket is required to transmit the high-speed signal.

In order to transmit the high-speed signal, it is preferable that a self-inductance of a contact pin included in the IC socket is low. Therefore, in general, it is preferable that the contact pin has a short length and a large diameter.

Another method corresponding to the high-speed signal is described in Patent Literature 1. Patent Literature 1 describes that "an LSI socket 101 of the invention is constituted by a printed board 102, a POGO pin 103 and a POGO pin supporting case 104. Printed board 102 has a plurality of through holes 109, into which POGO pins 103 are inserted. POGO pins 103 include a first power source pin 105, a second power source pin 106 having an applied voltage different from the first power pin, a GND pin 107 and a signal pin 108. On an inner surface of each through hole 109 other than through hole for signal pin 108, a plated layer 116 is formed."

Patent Literature 2 describes that "in general, a bypass chip capacitor for a power supply probe is mounted on a wiring pattern, which is electrically close to a device as possible, in a printed board at a lower side of a testing socket" and "it is necessary to mount the chip capacitor on an upper part of the testing socket, where is directly below a device to be tested."

PATENT LITERATURE

[PTL1] International Publication No. WO2005/006003
[PTL2] Japanese Unexamined Patent Publication (Kokai) No. 2009-85948

SUMMARY

As described above, the contact pin is required to be thick and short. However, there is a limit in increasing the thickness or the diameter of the contact pin, since a pitch between each terminal of the IC device becomes narrower. On the other hand, since the contact pin is generally expensive, the contact pin is usually replaced with another, after the contact pin is repeatedly used and the reliability of the contact pin is deteriorated. Therefore, in view of workability of replacement of the contact pin, it is necessary that the contact pin has a certain minimum length.

Otherwise, a capacitor may be directly connected to a casing of the IC socket or the contact pin incorporated in the IC socket, so as to follow the high frequency signal. However, when the capacitor is directly connected to the casing or the contact pin of the IC socket, a volume of the IC socket becomes larger, whereby a plurality of contact pins of the IC socket cannot be arranged in high density. However, even when the capacitor can be positioned or connected on or to the casing or near the board of the IC socket, the capacitor may be positioned on or connected to only a place where is separated from the contact pin by more than several millimeters. In such a case, the function of the capacitor may not be effectively brought out due to the length of a wire from the capacitor to the contact pin.

Thus, the invention provides an IC device testing socket, capable of improving signal transmission efficiency during testing of the IC device, without deteriorating the ability to replace the contact pin.

In order to achieve the object of the invention described above, the present invention provides an IC device testing socket comprising: a substrate; and a plurality of conductive contact pins, each held in a through hole provided in the substrate by means of friction force, wherein the substrate comprises: a base material; at least one dielectric layer stacked on the base material, the at least one dielectric layer having a dielectric constant higher than that of the base material; and conductive layers, stacked on the base material and provided on both side of the dielectric layer, and wherein at least one of the plurality of conductive contact pins is electrically connected to at least one of the conductive layers.

In an IC device testing socket according to the present invention, a substantially integral substrate may be formed by the high-dielectric layer and the conductive layers cooperatively constituting the capacitor and the base material including the capacitor, whereby the distance between the contact pin and the capacitor may be considerably small, and thus the performance of the IC socket may be improved. Further, since each contact pin is pressed into the substrate and held by the substrate, the substrate may also function as a support of each contact pin, whereby another member for supporting the contact pin is not necessary.

DETAILED DESCRIPTION

Figure 1:
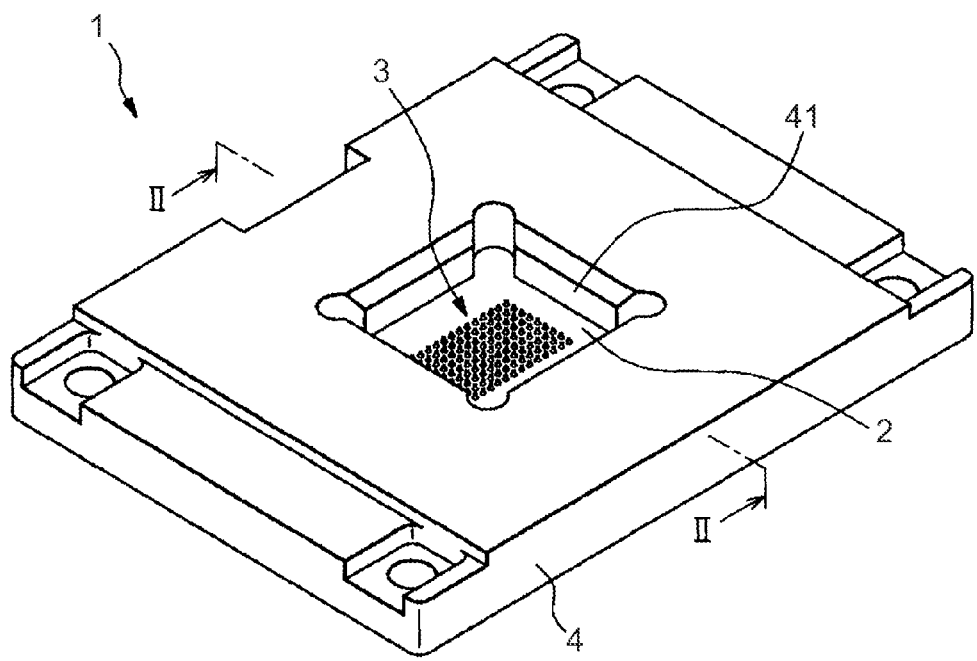
FIG. 1 is a perspective view of an IC socket according to an embodiment of the present invention.
Figure 2:
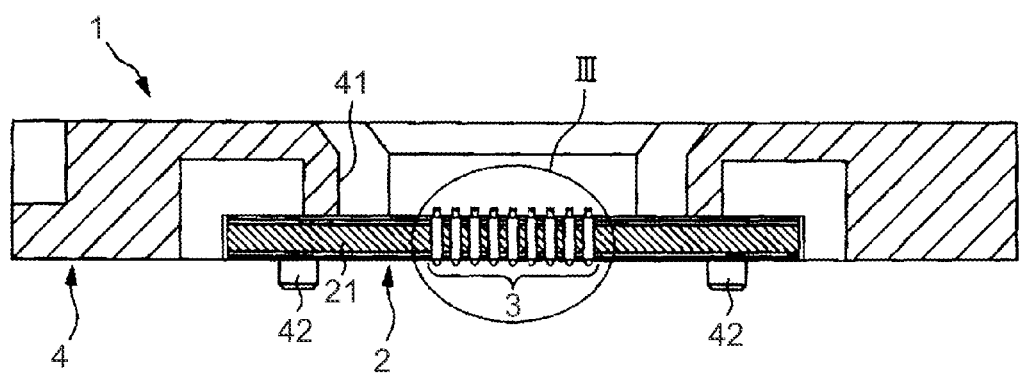
FIG. 2 is a cross-sectional view along II-II line of FIG. 1.

FIG. 1 is a perspective view of an IC device testing socket (hereinafter, referred to as an IC socket) 1 according to one embodiment of the present invention, and FIG. 2 is a cross-sectional view along a II-II line of FIG. 1. IC socket 1 has a substrate 2, a plurality of conductive contact pins 3 held by (for example, pressed into) substrate 2, and a guide body 4 which supports substrate 2. Guide body 4 has a guide surface 41 for locating an IC device to be tested (not shown) at a predetermined position on substrate 2. Guide body 4 further has a positioning member (a positioning pin 42 as shown in FIG. 2) for locating IC socket 1 at a predetermined position of a testing device (not shown) which tests the IC device. Guide body 4 may be incorporated in IC socket, if desired. Substrate 2 may have a hole or a notch which may constitute a positioning mechanism cooperatively with the positioning member.

Figure 3:
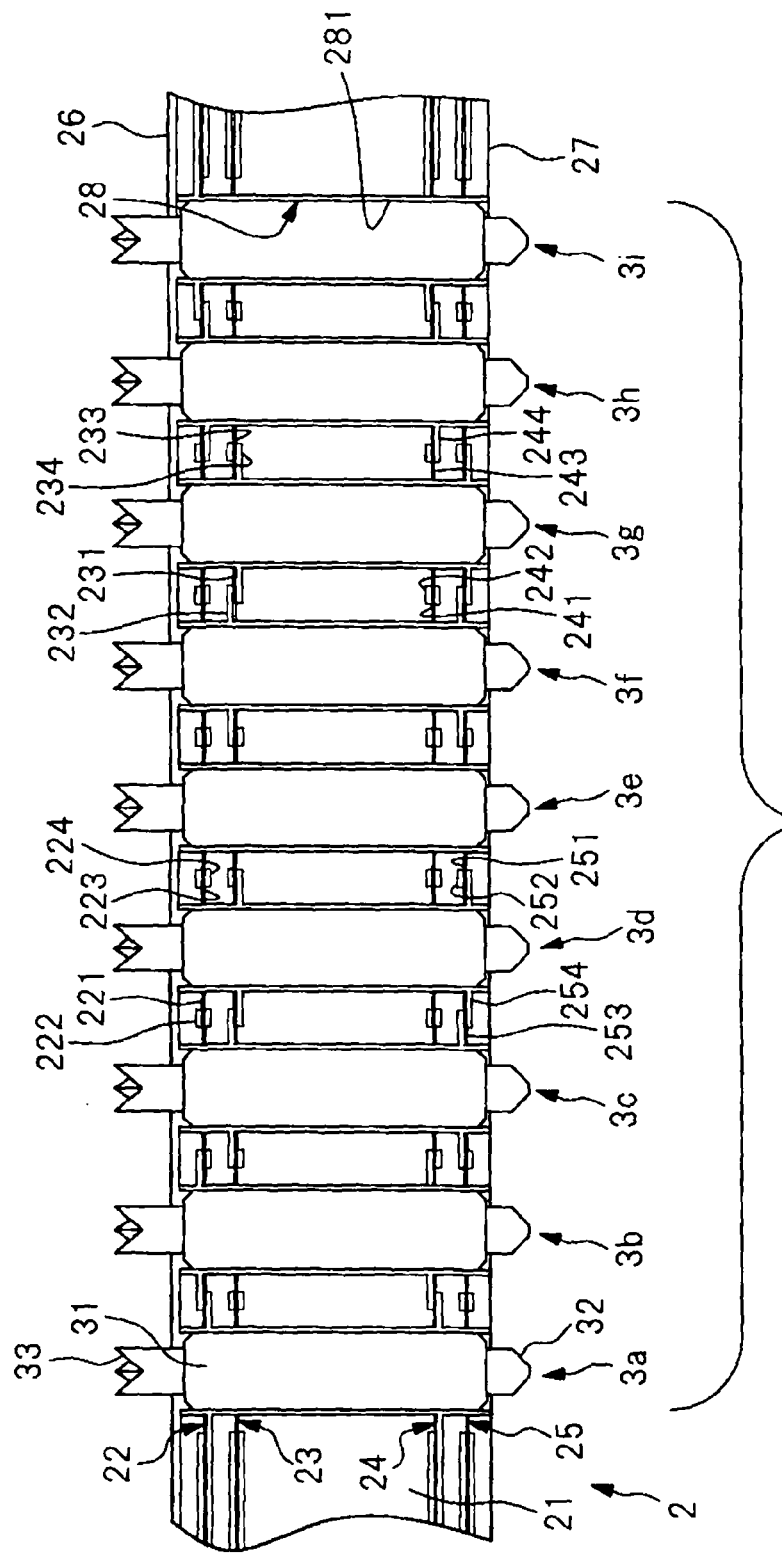
FIG. 3 is an enlarged view of III part of FIG. 2.

As shown in FIG. 3 indicating an enlarged view of a part III of FIG. 2, substrate 2 has at least one (four in the embodiment) dielectric layer 22-25 stacked on (preferably, embedded in) a base material 21 constituted by a dielectric material, such as glass epoxy. Each dielectric layer has a conductive layer, such as copper, provided on both sides thereof. Therefore, each dielectric layer and the conductive layers on both sides thereof cooperatively constitute a capacitor. In other words, substrate 2 is constituted by stacking base material 21, the conductive layers and the dielectric layer. In order to increase a capacity of the capacitor, it is preferable that a dielectric constant of each dielectric layer is high as possible. Further, it is preferable that each dielectric layer is a high dielectric member having the higher dielectric constant than that of base material 21. As the high dielectric material, an "Embedded Capacitor Material (ECM)", available from 3M Company, may be used. The ECM is provided as a flexible sheet from the high-dielectric material. Such a substrate may be made by a method of making a printed-circuit board.

The material constituting substrate 2 may include paper instead of glass fiber, and may include phenol resin or polyamide resin instead of epoxy resin. As the material constituting the conductive layer, silver or gold may be used instead of copper. The dielectric layer may include polymer. Preferably, the dielectric layer includes polymer and a plurality of particles. Concretely, the dielectric layer may be made by mixing resin and particles. Preferable resin may include epoxy, polyimide, polyvinylidene-fluoride, cyanoethyl pullulan, benzocyclobutene, polynorbornene, polytetrafluoro-ethylene, acrylate, and the mixture thereof. The particles may include dielectric (insulating) particles, for example, barium titanate, barium titanate strontium, oxidized titanium, lead titanate zirconium, and the mixture thereof.

For example, the thickness of each dielectric layer may be equal to or larger than 0.5 μm. The thickness of each dielectric layer may be equal to or smaller than 20 μm. The smaller the thickness, the larger is the electrostatic capacity of the capacitor. For example, the thickness may be equal to or smaller than 15 μm, or 10 μm. On the other hand, the larger the thickness, the stronger is the adhesive strength. For example, the thickness may be equal to or larger than 1 μm.

It is preferable that the relative permittivity of the dielectric layer is high as possible. For example, the relative permittivity may be equal to or larger than 10 or 12. Although there is no upper limit of the relative permittivity, the relative permittivity may be equal to or smaller than 30, 20 or 16.

When the high-dielectric material is used as the dielectric layer, the distance between the neighboring capacitors may be advantageously reduced. When two capacitors are positioned close to each other, the electrostatic capacitance may be also obtained between a power source layer of one capacitor and a ground (GND) layer of another neighboring capacitor. In the case that the high-dielectric material is used between the conductive layers, by which the electrostatic capacitance should be obtained, even when the distance between the conductive layers of one capacitor and the distance between two neighboring capacitors are equal to each other, the electrostatic capacitance of each capacitor may be increased. Therefore, the distance between the neighboring capacitors may be relatively small, whereby the thickness of the board may be reduced.

Among the conductive layers formed on the both sides of each high-dielectric layer, one conductive layer constitutes a power source layer electrically connected to the power source pin of the IC socket, and the other conductive layer constitutes a ground (GND) layer electrically connected to a ground pin of the IC socket. In detail, on an upper surface 221 of first dielectric layer 22, closest to an IC device-side surface (a top surface in FIG. 3) 26 of substrate 2, a first power source layer 222 is formed. Further, on a lower surface 223 of first dielectric layer 22, a first GND layer 224 is formed. Similarly, on an upper surface 231 of second dielectric layer 23, just below first dielectric layer 22, a second power source layer 232 is formed. Further, on a lower surface 233 of second dielectric layer 23, a second GND layer 234 is formed. On an upper surface 251 of fourth dielectric layer 25, closest to a testing device-side surface (a bottom surface in FIG. 3) 27 of substrate 2, a fourth power source layer 252 is formed. Further, on a lower surface 253 of fourth dielectric layer 25, a fourth GND layer 254 is formed. Similarly, on an upper surface 241 of third dielectric layer 24, just above fourth dielectric layer 25, a third power source layer 242 is formed. Further, on a lower surface 243 of third dielectric layer 24, a third GND layer 244 is formed. In this connection, first and third power source layers 222 and 242 are substantially unipotential, and second and fourth power source layers 232 and 252 are substantially unipotential. Similarly, first and third GND layers 224 and 244 are substantially unipotential, and second and fourth GND layers 234 and 254 are substantially unipotential.

Each high-dielectric layer and the conductive layers on the both sides thereof are provided on substrate 2. Therefore, an area of the capacitor thus formed may be generally the same as that of substrate 2.

Each contact pin 3 extends generally perpendicular to surfaces 26 and 27 of substrate 2, and penetrates substrate 2. In detail, a through hole 28, into which each contact pin may be pressed, is formed in base material 21 of substrate 2, each high-dielectric layer and conductive layer. A conductive material 281, such as copper, silver or gold, is provided on an inner surface of each through hole 28 by plating or the like. By electrically connecting conductive material 281 to one of the conductive layers, a pin body 31 of contact pin 3 is electrically connected to the one of the conductive layers via conductive material 281, except that the contact pin is a signal pin. It is optional to form conductive material 281 on the inner surface of the through hole for the signal pin.

The dimension of each through hole 28 is determined so that contact pin 3 inserted into and held by the through hole does not fall due to a repulsive force of a spring incorporated in the contact pin, when IC socket 1 is positioned on a board of the testing device. For example, it is preferable that the holding force of the contact pin is equal to or larger than 0.1 N. Also, the dimension of each through hole 28 is determined so that the contact pin is easily pulled out from the through hole when the contact pin should be repaired or replaced. For example, it is preferable that the holding force of the contact pin is equal to or smaller than 2.0 N.

Each contact pin 3 has a generally cylindrical pin body 31 pressed into and held by substrate 2, a first contact portion 32 projecting from one end (the lower end in the embodiment) of pin body 31 and electrically contacted to the testing device, and a second contact portion 33 projecting from the other end (the upper end in the embodiment) of pin body 31 and electrically contacted to the IC device. The contact pin may have various types of shape. For example, a POGO pin type, in which two contact portions 32, 33 may be displaced relative to pin body 31 by means of a spring or the like (not shown), is preferable.

It is preferable that pin body 31 of contact pin 3 is cylindrical. In such a contact pin, the outer surface of pin body 31 may contact the inner surface of through hole 28 in a wide area, whereby the contact pin may be coaxially arranged with through hole 28. Further, due to the wide contact area between conductive material 281 and the contact pin, the electric connection between them may be stable.

Contact pins 3 may be classified into a power source pin electrically connected to the power source layer, a ground (GND) pin electrically connected to the GND layer, and a signal pin which is not connected to either of the layers. For example, as shown in FIG. 3, each of contact pins 3b and 3i, connected to first and third power source layers 222 and 242, functions as a first power source pin. Each of contact pins 3c and 3f, connected to second and fourth power source layers 232 and 252, functions as a second power source pin. Similarly, each of contact pins 3a and 3h, connected to first and third GND layers 224 and 244, functions as a first GND pin. Each of contact pins 3d and 3g, connected to second and fourth GND layers 234 and 254, functions as a second GND pin. A contact pin 3e, which is not connected to either of the layers, functions as the signal pin.

In one embodiment of the present invention, due to the high-dielectric layer and the conductive layers constituting the capacitor and the base material embedding the capacitor, the substrate may be substantially integrally formed. Therefore, the distance between the contact pin and the capacitor may be significantly small, whereby the performance of the IC socket may be improved. Since each contact pin is held by (preferably, pressed into) the substrate by means of friction force, the substrate may function as a support for the contact pins, whereby an additional member for supporting the contact pin is not necessary. In other words, each contact pin may be held and positioned by means of only the substrate.

Further, by using the high-dielectric material, the thickness of the substrate may be significantly reduced.

As shown in FIG. 3, it is preferable that the capacitor within substrate 2, having the high-dielectric layer sandwiched by the power source layer and the GND layer, is positioned as close as possible to top surface 26 or bottom surface 27 of substrate 2. This is because, the smaller the distance between the surface of substrate 2 and the conductive layer is, the signal transmission property may be more improved during testing the IC device. Concretely, the smaller the distance between top surface 26 of substrate 2 and high-dielectric layer 22 or 23 is, the input sensitivity of the IC device to be tested is more improved, and the smaller the distance between bottom surface 27 of substrate 2 and high-dielectric layer 24 or 25 is, the output sensitivity of the IC device to be tested is more improved. In the present invention, the substrate, including the high-dielectric layer sandwiched by the power source layer and the GND layer, is substantially integrally formed, the capacitor may be easily positioned close to the surface of the substrate, whereby the test of the IC device can be carried out with a high degree of accuracy.

Since the contact pin is held by substantially only the substrate, as described above, the capacitor may be arranged an arbitrary position. The substrate may include an additional capacitor, having a high-dielectric layer and conductive layers formed on both sides thereof, at generally the intermediate position in relation to the thickness direction of the substrate.

It is preferable that the length of the contact pin is as small as possible, in view of the signal transmission property. However, the smaller the length of the contact pin is, it is more difficult to replace or assemble the contact pin. According to the invention, due to the configuration of substrate 2, the same effect, as when a relatively short POGO pin is used, may be obtained in relation to the signal transmission property. Therefore, even when a relatively long contact pin is used, the performance of the IC socket cannot be deteriorated.

When the length of pin body 31 is larger than the thickness of substrate 2, the signal transmission property may be deteriorated due to accordingly the long contact pin. On the other hand, when the length of pin body 31 is smaller than the thickness of substrate 2 and the position of the end of pin body 31 is closer to the center of the substrate than one of the conductive layers in relation to the thickness direction of the substrate, the performance of the IC socket may be deteriorated due to a complicated path from the contact pin to the conductive layer. Therefore, it is preferable that the axial length of pin body 31 of each contact pin 3 is generally equal to the thickness of substrate 2.

REFERENCE SIGNS LIST

1 IC socket
2 substrate
21 base material
22-25 high-dielectric material
222, 232, 242, 252 power source layer
224, 234, 244, 254 GND layer
28 through hole
3 contact pin
31 pin body
32 first contact portion
33 second contact portion
4 guide body

What is claimed is:

1. An IC device testing socket comprising:
a substrate; and
a plurality of conductive contact pins, each frictionally held in a through hole in the substrate,
wherein the substrate comprises:
 a base material;
 at least one dielectric layer stacked on the base material, the at least one dielectric layer having a dielectric constant higher than that of the base material; and
 conductive layers stacked on the base material and provided on both sides of the dielectric layer, and
wherein at least one of the plurality of conductive contact pins is electrically connected to at least one of the conductive layers.

2. The IC device testing socket according to claim 1, wherein the substrate comprises a first surface and an opposed second surface, and wherein the dielectric layer is positioned proximal the first surface of the substrate.

3. The IC device testing socket according to claim 2, wherein the substrate further comprises a second dielectric layer positioned proximal the second surface of the substrate.

4. The IC device testing socket according to claim 1, wherein the at least one dielectric layer and the conductive layers are embedded in the substrate.

5. The IC device testing socket according to claim 1, wherein the relative permittivity of the at least one dielectric layer is 10 to 30.

6. The IC device testing socket according to claim 1, wherein the relative permittivity of the at least one dielectric layer is 12 to 20.

7. The IC device testing socket according to claim 1, wherein the relative permittivity of the at least one dielectric layer is 10 to 16.

8. The IC device testing socket according to claim 1, wherein the at least one dielectric layer comprises a polymer and a plurality of insulating particles.

9. The IC device testing socket according to claim 8, wherein the insulating particles are selected from the group consisting of barium titanate, barium titanate strontium, oxidized titanium, lead titanate zirconium, and mixtures thereof.

10. The IC device testing socket according to claim 8, wherein the polymer is selected from the group consisting of epoxy, polyimide, polyvinylidene-fluoride, cyanoethyl pullulan, benzocyclobutene, polynorbornene, polytetrafluoroethylene, acrylate, and mixtures thereof.

11. The IC device testing socket according to claim 1, wherein the thickness of the at least one dielectric layer is 0.5 μm to 20 μm.

12. The IC device testing socket according to claim 1, wherein the thickness of the at least one dielectric layer is 1 μm to 15 μm.

13. The IC device testing socket according to claim 1, wherein the thickness of the at least one dielectric layer is 1 μm to 10 μm.

* * * * *